(12) United States Patent
Koch

(10) Patent No.: US 9,917,558 B1
(45) Date of Patent: Mar. 13, 2018

(54) APPARATUS AND METHODS FOR A DIFFERENCE AMPLIFIER

(71) Applicant: Analog Devices Global, Hamilton (BM)

(72) Inventor: Andreas Koch, Wiesbaden (DE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/264,432

(22) Filed: Sep. 13, 2016

(51) Int. Cl.
*H03F 3/45* (2006.01)

(52) U.S. Cl.
CPC .......... *H03F 3/45973* (2013.01); *H03F 3/45* (2013.01); *H03F 3/45475* (2013.01); *H03F 2200/261* (2013.01); *H03F 2200/481* (2013.01); *H03F 2203/45138* (2013.01)

(58) Field of Classification Search
CPC .. H03F 3/45; H03F 3/45475; H03F 2200/261; H03F 2203/45138; H03F 1/34; H03F 3/45183; H03F 3/45479; H03F 1/36; H03F 3/68

USPC .......................................................... 330/69
See application file for complete search history.

(56) References Cited

U.S. PATENT DOCUMENTS

2003/0169104 A1 * 9/2003 Huckins .................. H03F 1/086
330/69

* cited by examiner

*Primary Examiner* — Khanh V Nguyen
(74) *Attorney, Agent, or Firm* — Schwegman Lundberg & Woessner, P.A.

(57) ABSTRACT

Apparatus and methods for a difference amplifier are provided. In certain examples, the difference amplifier can provide high common mode rejection without differential signal attenuation. In an example, a difference amplifier circuit can include first and second amplifiers, first and second buffer amplifiers, a first feedback voltage divider coupled between an output of the first buffer amplifier and an output of the second amplifier, and a second feedback voltage divider coupled between an output of the second buffer amplifier and an output of the first amplifier.

18 Claims, 3 Drawing Sheets

US 9,917,558 B1

APPARATUS AND METHODS FOR A DIFFERENCE AMPLIFIER

TECHNICAL FIELD

The present disclosure relates to amplifiers and, in particular, a difference amplifier that can provide high common mode rejection without differential signal attenuation.

BACKGROUND

Previous techniques to provide rejection of high common mode voltages can attenuate not only the common mode voltage but also the differential input signal. The differential signal would then be amplified to provide the desired output signal. The attenuation amplification process results in a degraded signal quality as the amplification also amplifies noise in the signal and noise associated with processing the signal.

SUMMARY OF THE DISCLOSURE

Apparatus and methods for a difference amplifier are provided. In certain examples, the difference amplifier can provide high common mode rejection without differential signal attenuation. In an example, a difference amplifier circuit can include first and second amplifiers, first and second buffer amplifiers, a first feedback voltage divider coupled between an output of the first buffer amplifier and an output of the second amplifier, and a second feedback voltage divider coupled between an output of the second buffer amplifier and an output of the first amplifier.

This summary is intended to provide an overview of subject matter of the present patent application. It is not intended to provide an exclusive or exhaustive explanation of the present subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized circuitry and methods for a differential amplifier that can comprehensively attenuate common mode signals without attenuating the differential signal. In certain examples, high common mode noise can be attenuated without increasing differential noise signals. In certain examples, the symmetry of the circuitry can allow for very high bandwidth of the common mode rejection ratio.

Previous techniques to provide rejection of high common mode voltages can actively attenuate not only the common mode voltage but also the differential input signal. The differential signal would then be amplified to provide the desired output signal. The attenuation/amplification process results in a degraded signal quality as the amplification also amplifies noise in the signal and noise associated with processing the signal.

Figure 1:
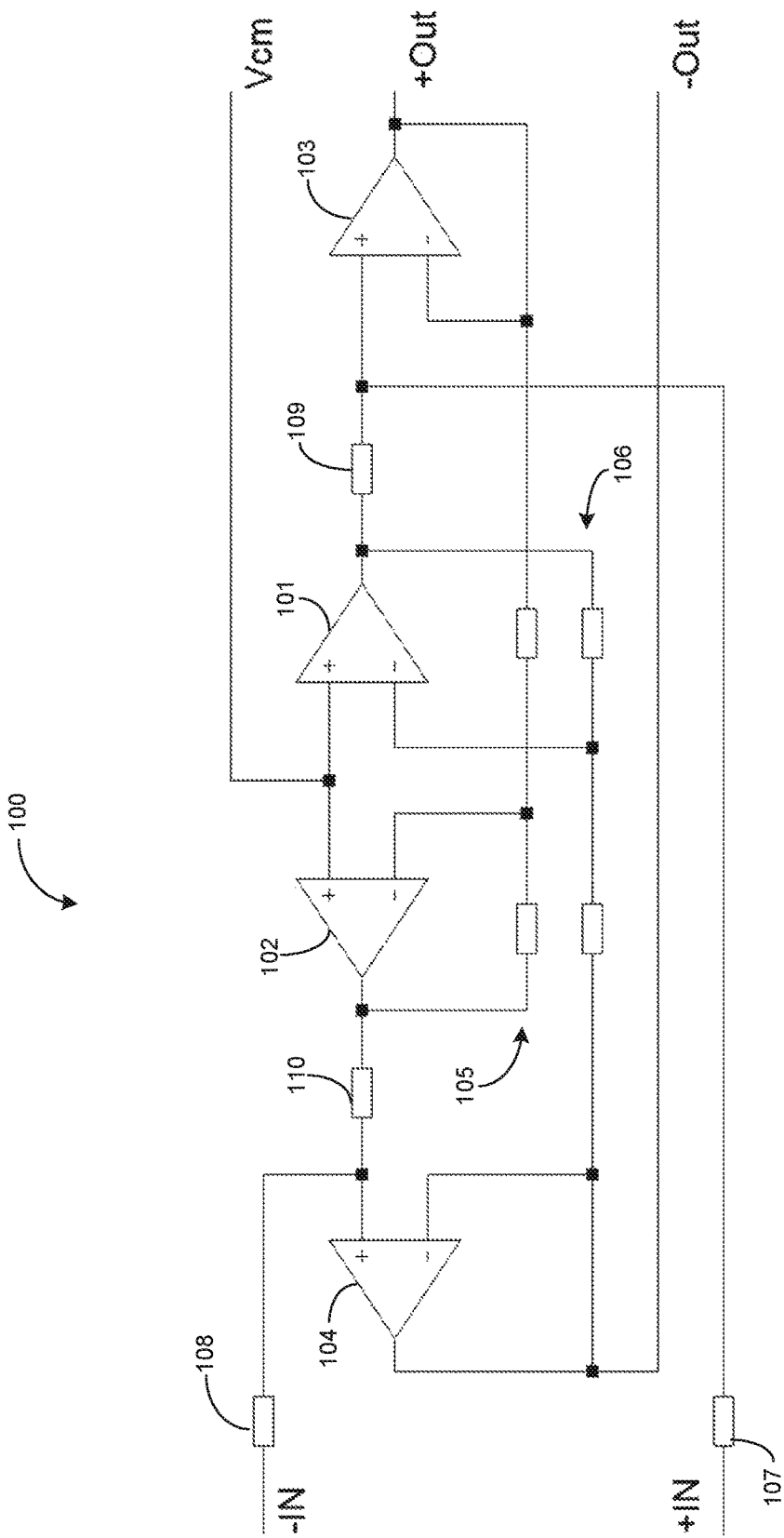
FIG. 1 illustrates generally a difference amplifier according to an example of the present subject matter.

FIG. 1 illustrates generally a difference amplifier 100 according to an example of the present subject matter. In certain examples, the difference amplifier 100 can include first and second amplifiers 101, 102, first and second buffer amplifiers 103, 104, first and second feedback voltage dividers 105, 106, first and second input impedances 107, 108, and first and second current sense impedances 109, 110. In certain examples, difference amplifier 100 can act like a teeter-totter which can easily teeter in response to differential voltages at the differential inputs (+IN, −IN) but does not allow common mode voltages received at the differential inputs (+IN, −IN) to lift the output voltages (Out+, Out−). In certain examples, a positive voltage on a first input can force the second input to go negative (and vice versa). From another perspective, a voltage applied to a first input can subtract that voltage from the second input. If the same voltage is applied to both inputs of the differential amplifier, they will cancel each other out. As such, a perfectly balanced differential signal, with no common-mode voltage, received at an example difference amplifier 100 can encounter an ideally infinite input impedance.

In certain examples, each input (+IN, −IN) of the difference amplifier can be connected via an input impedance 107, 108 to a current sense impedance 109, 110. Each current sense impedance 109, 110 can be coupled to an output of a corresponding one of the first or second amplifiers 101, 102. Each input impedance 107, 108 can also be connected to an input of one of the first or second buffer amplifiers 103, 104. In certain examples, the buffer amplifiers 103, 104 can separate each feedback voltage divider 105, 106 from a corresponding input circuit, thus, in an ideal situation, allowing ideally infinite differential input impedance. It is understood that in reality, ideally infinite impedances can be limited by the properties of the individual components of the difference amplifier 100. The output of each buffer 103, 104 can be connected via a feedback voltage divider 105, 106 to the inverting input of the other amplifier 101, 102. The other amplifier 101, 102 can be connected via the other current sense resistor 109, 110 and other input impedance 107, 108 to the other input of the difference amplifier 100.

In certain examples, a differential voltage received at the input impedances 107, 108 via the inputs (+IN, −IN) of the difference amplifier 100 can cause a voltage drop at the respective current sense impedance 109, 110 coupled between the input impedances 107, 108 and the output of one of the amplifiers 101, 102. An inverted voltage drop generated via a buffer 103, 104 can appear at the other input via the other buffer and can push to increase the differential voltage across the difference amplifier inputs (+IN, −IN). The voltage push can reduce current flow into the inputs until differential current becomes zero and the outputs (Out+, Out−) of the difference amplifier 100 provide a representation of the differential voltage at the inputs (IN+, IN−) of the difference amplifier 100.

In certain examples, a common mode voltage received at the inputs (IN+, IN−) of the difference amplifier 100 can cause current to flow through the current sense impedance 109, 110. The opposing current flow can appear at the other input via the feedback network 105, 106 and can cause an equal current flow into each difference amplifier input (IN+, IN−). The impedance can appear to be zero, thus, rejecting the common mode voltages from appearing at the outputs (Out+, Out−) of the difference amplifier 100.

In certain examples, the difference amplifier can include a common mode input for receiving a common-mode voltage. The common mode input can be connected to the non-inverting inputs of the amplifiers 101, 102. An offset voltage received at the common mode input can offset the differential voltage at the output with respect to ground. For example, an offset voltage can be received, via a common mode input terminal, at a first input of the first amplifier and at a first input of the second amplifier. The output of the first amplifier and the output of the second amplifier can simultaneously offset the output of the first buffer amplifier and the output of second buffer amplifier by the offset voltage. As a consequence, the voltage at the output of the difference amplifier can be simultaneously offset relative to ground while the voltage difference between the outputs of the difference amplifier continue to reflect the voltage difference between the inputs of the difference amplifier.

Figure 2:
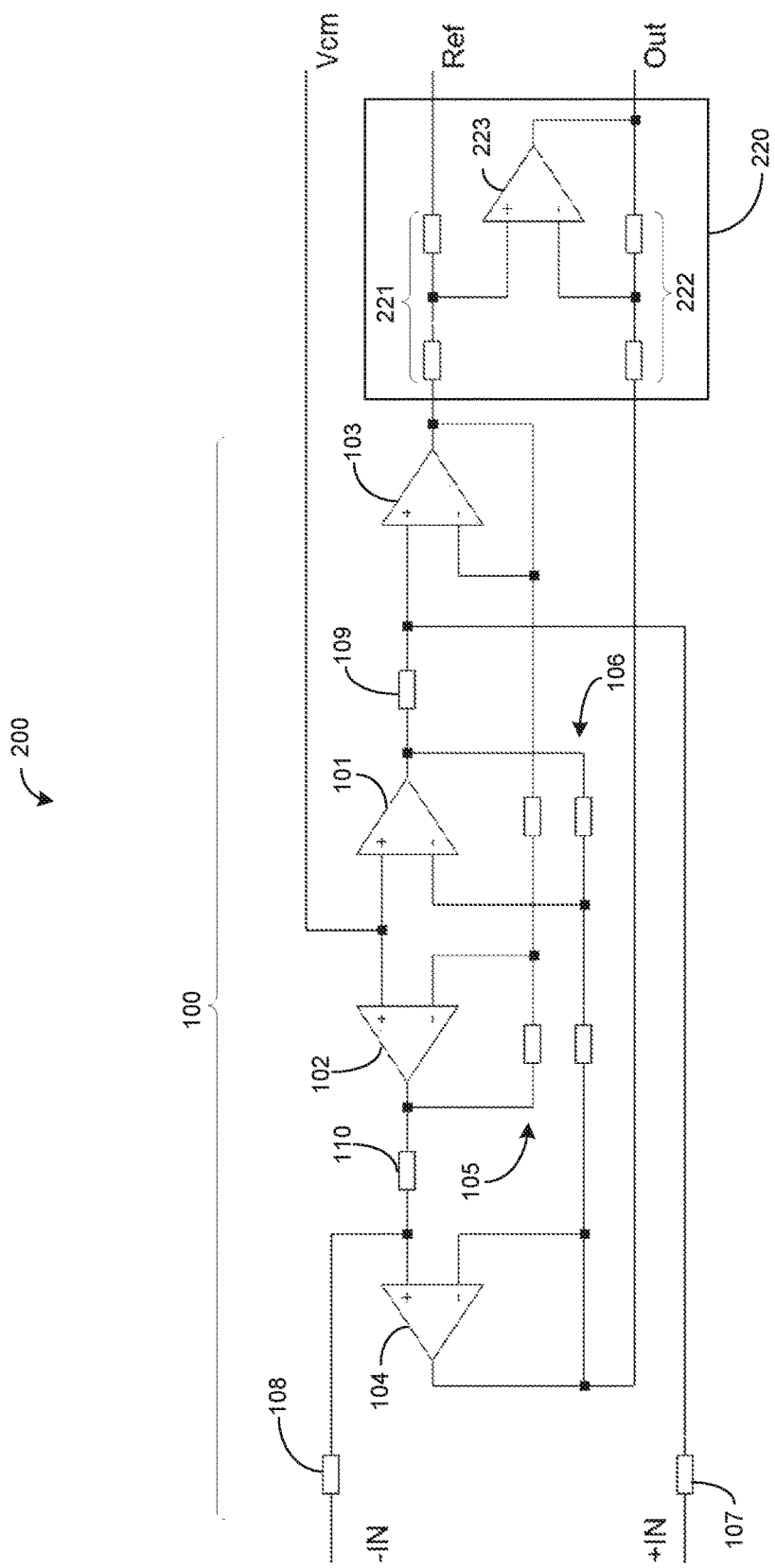
FIG. 2 illustrates generally a difference amplifier with a single ended output according to an example of the present subject matter.

FIG. 2 illustrates generally a single-ended difference amplifier 200 according to an example of the present subject matter. In certain examples, the difference amplifier of FIG. 1 can be converted to a single-ended difference amplifier by adding an output amplifier circuit 220 that can receive the differential output via two output voltage dividers 221, 222. In addition to the voltage dividers, the output amplifier circuit 220 can include an output amplifier 223. Each input of the output amplifier 223 can be coupled to a middle node of a corresponding output voltage divider 221, 222. The output of the output amplifier 223 can be coupled to one of the voltage dividers 222 at an end opposite a first output of the difference amplifier 100 to provide a single-ended output. The other voltage divider 221 can have an end opposite a second output of the difference amplifier 100 coupled to a reference voltage (Ref), such as ground, for example.

Figure 3:
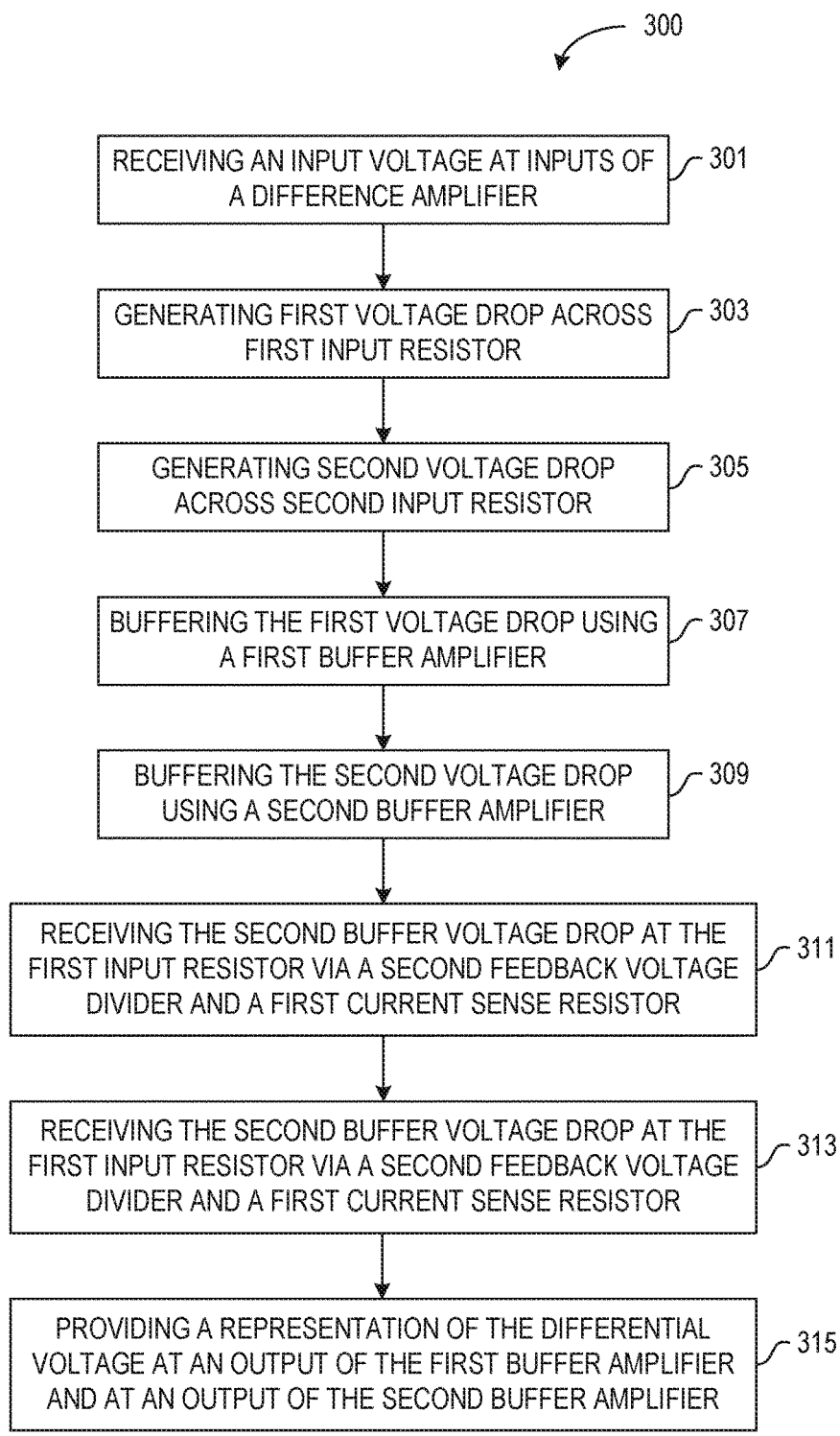
FIG. 3 illustrates generally a flowchart of a method for operating a differential amplifier according to an example of the present subject matter.

FIG. 3 illustrates generally a flowchart of a method 300 for operating a differential amplifier according to an example of the present subject matter. The method 300, at 301, can include receiving an input voltage at first and second inputs of a differential amplifier. In certain examples, the input voltage can include a differential voltage that result in a voltage difference between a first input of the difference amplifier and a second input of the difference amplifier. In some examples, the input voltage can include a common mode voltage that can result in the first input of the difference amplifier being at the same voltage level of the second input of the difference amplifier. In some examples, the input voltage can include both a differential voltage and a common mode voltage.

At 303, a first voltage drop can be generated across a first input resistor that is coupled to the first input of the difference amplifier. At 305, a second voltage drop can be generated across a second input resistor that can be coupled to the second input of the difference amplifier. At 307, the first voltage drop can be buffered, using a first buffer amplifier, to provide a first buffered voltage drop. At 309, the second voltage drop can be buffered, using the second buffer amplifier, to provide a second buffered voltage drop. At 311, the second buffer voltage drop can be received at the first input resistor via a second feedback voltage divider and a first current sense resistor. At 313, the first buffered voltage drop can be received at the second input resistor via a second feedback voltage divider and a first current sense resistor. At 315, a representation of a voltage difference of the input voltage can be provided at the output of the difference amplifier. The output of difference amplifier can include an output of the first buffer amplifier and an output of the second buffer amplifier.

In certain examples, an offset voltage can be simultaneously received, via a common mode input terminal, at a first input of the first amplifier and at a first input of the second amplifier and the output of the first buffer amplifier and the output of second buffer amplifier can be offset by the offset voltage such that, with reference to ground, each output of the difference amplifier include the voltage offset. In certain examples, a representation of a common mode voltage of the input voltage is not provided at the output of the first buffer amplifier and at the output of the second buffer amplifier.

VARIOUS NOTES & EXAMPLES

In Example 1, a difference amplifier circuit can include first and second amplifiers, first and second buffer amplifiers, a first feedback voltage divider coupled between an output of the first buffer amplifier and an output of the second amplifier, and a second feedback voltage divider coupled between an output of the second buffer amplifier and an output of the first amplifier.

In Example 2, the first buffer amplifier of Example 1 optionally is configured to receive a first input of the difference amplifier and an output of the first amplifier at a non-inverting input and to provide a first output of the difference amplifier.

In Example 3, the second buffer amplifier of any one or more of Examples 1-2 optionally is configured to receive a second input of the difference amplifier and an output of the second amplifier at a non-inverting input and to provide a second output of the difference amplifier.

In Example 4, a voltage difference of an output of the first buffer amplifier and an output of the second buffer amplifier of any one or more of Examples 1-3 optionally is a representation of a voltage difference between the first input and the second input.

In Example 5, the first feedback voltage divider of any one or more of Examples 1-4 optionally includes first and second impedances coupled in series via a first intermediate node.

In Example 6, the first intermediate node of any one or more of Examples 1-5 optionally is directly coupled to an inverting input of the second amplifier.

In Example 7, the second feedback voltage divider of any one or more of Examples 1-6 optionally includes first and second impedances coupled in series via a second intermediate node.

In Example 8, the second intermediate node of any one or more of Examples 1-7 optionally is directly coupled to an inverting input of the first amplifier.

In Example 9, the difference amplifier of any one or more of Examples 1-3 optionally includes a common mode input terminal configured to receive an offset voltage and to offset the output of the first buffer amplifier and the output of second buffer amplifier by the offset voltage.

In Example 10, the common mode input terminal of any one or more of Examples 1-9 optionally is coupled to a first input of the first amplifier and to a first input of the second amplifier.

In Example 11, the difference amplifier of any one or more of Examples 1-10 optionally includes a first input of the difference amplifier circuit coupled to a non-inverting input of the first buffer amplifier via a first input impedance.

In Example 12, the difference amplifier of any one or more of Examples 1-11 optionally includes a second input of the difference amplifier circuit coupled to a non-inverting input of the second buffer amplifier via a second input impedance.

In Example 13, the difference amplifier of any one or more of Examples 1-12 optionally includes a first current sense impedance coupled between the output of the first amplifier and an input of the first buffer amplifier.

In Example 14, the difference amplifier of any one or more of Examples 1-3 optionally includes a second current sense impedance coupled between the output of the second amplifier and an input of the second buffer amplifier.

In Example 15, a method for operating a difference amplifier can include receiving an input voltage at first and second inputs of a differential amplifier, generating a first voltage drop across an first input resistor coupled to the first input, generating a second voltage drop across a second input resistor coupled to the second input, buffering the first voltage drop using a first buffer amplifier to provide a first buffered voltage drop, buffering the second voltage drop using the second buffer amplifier to provide a second buffered voltage drop, receiving the second buffer voltage drop at the first input resistor via a second feedback voltage divider and a first current sense resistor, receiving the first buffered voltage drop at the second input resistor via a second feedback voltage divider and a first current sense resistor, and providing a representation of a voltage difference of the input voltage at an output of the first buffer amplifier and at an output of the second buffer amplifier.

In Example 16, the method of any one or more of Examples 1-15 optionally includes simultaneously receiving an offset voltage, via a common mode input terminal, at a first input of the first amplifier and at a first input of the second amplifier.

In Example 17, the method of any one or more of Examples 1-16 optionally includes offsetting the output of the first buffer amplifier and the output of second buffer amplifier by the offset voltage.

In Example 18, the method of any one or more of Examples 1-17 optionally includes not providing a representation of a common mode voltage of the input voltage at the output of the first buffer amplifier and at the output of the second buffer amplifier.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A difference amplifier circuit comprising:
   first and second amplifiers;
   first and second buffer amplifiers;
   a first feedback voltage divider coupled between an output of the first buffer amplifier and an output of the second amplifier; and
   a second feedback voltage divider coupled between an output of the second buffer amplifier and an output of the first amplifier.

2. The difference amplifier circuit of claim 1, wherein the first buffer amplifier is configured to receive a first input of the difference amplifier circuit and an output of the first amplifier at a non-inverting input and to provide a first output of the difference amplifier circuit.

3. The difference amplifier circuit of claim 2, wherein the second buffer amplifier is configured to receive a second input of the difference amplifier circuit and an output of the second amplifier at a non-inverting input and to provide a second output of the difference amplifier circuit.

4. The difference amplifier circuit of claim 3, wherein a voltage difference of an output of the first buffer amplifier and an output of the second buffer amplifier is a representation of a voltage difference between the first input and the second input.

5. The difference amplifier circuit of claim 1, wherein the first feedback voltage divider includes first and second impedances coupled in series via a first intermediate node.

6. The difference amplifier circuit of claim 5, wherein the first intermediate node is directly coupled to an inverting input of the second amplifier.

7. The difference amplifier circuit of claim 6, wherein the second feedback voltage divider includes first and second impedances coupled in series via a second intermediate node.

8. The difference amplifier circuit of claim 7, wherein the second intermediate node is directly coupled to an inverting input of the first amplifier.

9. The difference amplifier circuit of claim 1, including a common mode input terminal configured to receive an offset voltage and to offset the output of the first buffer amplifier and the output of second buffer amplifier by the offset voltage.

10. The difference amplifier circuit of claim 9, wherein the common mode input terminal is coupled to a first input of the first amplifier and to a first input of the second amplifier.

11. The difference amplifier circuit of claim 1, including a first input of the difference amplifier circuit coupled to a non-inverting input of the first buffer amplifier via a first input impedance.

12. The difference amplifier circuit of claim 11, including a second input of the difference amplifier circuit coupled to a non-inverting input of the second buffer amplifier via a second input impedance.

13. The difference amplifier circuit of claim 1, including a first current sense impedance coupled between the output of the first amplifier and an input of the first buffer amplifier.

14. The difference amplifier circuit of claim 13, including a second current sense impedance coupled between the output of the second amplifier and an input of the second buffer amplifier.

15. A method for operating a difference amplifier, the method comprising:
    receiving an input voltage at first and second inputs of a differential amplifier;
    generating a first voltage drop across a first input resistor coupled to the first input;
    generating a second voltage drop across a second input resistor coupled to the second input;
    buffering the first voltage drop using a first buffer amplifier to provide a first buffered voltage drop;
    buffering the second voltage drop using the second buffer amplifier to provide a second buffered voltage drop;
    receiving the second buffer voltage drop at the first input resistor via a first feedback voltage divider and a first current sense resistor;
    receiving the first buffered voltage drop at the second input resistor via a second feedback voltage divider and a second current sense resistor; and
    providing a representation of a voltage difference of the input voltage at an output of the first buffer amplifier and at an output of the second buffer amplifier.

16. The method of claim 15, including simultaneously receiving an offset voltage, via a common mode input terminal, at a first input of the first amplifier and at a first input of the second amplifier.

17. The method of claim 16, including offsetting the output of the first buffer amplifier and the output of second buffer amplifier by the offset voltage.

18. The method of claim 15, including not providing a representation of a common mode voltage of the input voltage at the output of the first buffer amplifier and at the output of the second buffer amplifier.

* * * * *

UNITED STATES PATENT AND TRADEMARK OFFICE
CERTIFICATE OF CORRECTION

PATENT NO. : 9,917,558 B1
APPLICATION NO. : 15/264432
DATED : March 13, 2018
INVENTOR(S) : Andreas Koch Page 1 of 1

It is certified that error appears in the above-identified patent and that said Letters Patent is hereby corrected as shown below:

On the Title Page

In item (22), in "Filed", in Column 1, Line 1, after "2016", insert --¶(65) Prior Publication Data US 2018/0076782 A1 Mar. 15, 2018--

Signed and Sealed this
Eighteenth Day of June, 2019

Andrei Iancu
*Director of the United States Patent and Trademark Office*